United States Patent
Joo

(10) Patent No.: US 7,606,089 B2
(45) Date of Patent: Oct. 20, 2009

(54) DATA STROBE SIGNAL GENERATOR FOR GENERATING DATA STROBE SIGNAL BASED ON ADJUSTABLE PREAMBLE VALUE AND SEMICONDUCTOR MEMORY DEVICE WITH THE SAME

(75) Inventor: Yong Suk Joo, Kyeongki-do (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 330 days.

(21) Appl. No.: 11/637,019

(22) Filed: Dec. 12, 2006

(65) Prior Publication Data

US 2007/0291558 A1 Dec. 20, 2007

(30) Foreign Application Priority Data

Jun. 15, 2006 (KR) .................. 10-2006-0053952

(51) Int. Cl.
*G11C 7/00* (2006.01)
(52) U.S. Cl. .............. 365/193; 365/189.12; 365/194; 365/230.08; 365/233.12
(58) Field of Classification Search .......... 365/193, 365/189.11, 194, 189.12, 230.08, 233.12
See application file for complete search history.

(56) References Cited

U.S. PATENT DOCUMENTS

| | | | | |
|---|---|---|---|---|
| 2,122,215 | A * | 6/1938 | Saelen | ............ 43/17.6 |
| 6,212,126 | B1 * | 4/2001 | Sakamoto | ........ 365/233.14 |
| 6,215,710 | B1 | 4/2001 | Han et al. | |
| 6,671,787 | B2 * | 12/2003 | Kanda et al. | ............ 711/167 |
| 7,355,901 | B2 * | 4/2008 | Kim et al. | ........ 365/189.05 |
| 2006/0083081 | A1 | 4/2006 | Park et al. | |
| 2006/0250861 | A1 | 11/2006 | Park et al. | |

FOREIGN PATENT DOCUMENTS

| | | |
|---|---|---|
| KR | 1020000027381 | 5/2000 |
| KR | 1020000044622 | 7/2000 |
| KR | 1020010004324 | 1/2001 |
| KR | 1020030078307 | 10/2003 |
| KR | 1020030091233 | 12/2003 |

OTHER PUBLICATIONS

Notice of Allowance for Korean app. 10-2006-0053952.

\* cited by examiner

*Primary Examiner*—Pho M. Luu
(74) *Attorney, Agent, or Firm*—Lowe Hauptman Ham & Berner, LLP

(57) ABSTRACT

A data strobe signal generator includes a control unit, a pulse delay unit, a clock generator, and a data strobe output unit. The control unit generates a CAS latency signal and a preamble signal. The pulse delay unit delays a pulse signal for predetermined time and outputs a delayed pulse signal. The clock generator outputs a control clock signal. The data strobe output unit outputs a data strobe signal. The data strobe signal generator and the semiconductor memory device having the same generate a data strobe signal based on an adjustable preamble value, thereby ensuring the stabilized data output operation of a high-speed memory device.

30 Claims, 4 Drawing Sheets

DATA STROBE SIGNAL GENERATOR FOR GENERATING DATA STROBE SIGNAL BASED ON ADJUSTABLE PREAMBLE VALUE AND SEMICONDUCTOR MEMORY DEVICE WITH THE SAME

CROSS-REFERENCES TO RELATED APPLICATIONS

The present application claims priority to Korean patent application number 10-2006-053952, filed on Jun. 15, 2006, which is incorporated by reference in its entirety.

BACKGROUND OF THE INVENTION

The present invention relates generally to a semiconductor device and, more particularly, to a data strobe signal generator and a semiconductor memory device including the same.

Generally, the data input circuit of a semiconductor memory device receives input data in synchronization with a data strobe signal received from an external device. Furthermore, the data output circuit of the semiconductor memory device outputs output data to the external device in synchronization with a data strobe signal. At the time of data input operation, the semiconductor memory device receives the data strobe signal from the external device but, at the time of data output operation, the semiconductor memory device generates the data strobe signal for the output of data. Therefore, the semiconductor memory device includes a strobe signal generator for generating a data strobe signal. Generally, a time point at which a data strobe signal is generated is determined by predetermined Column Address Strobe (CAS) Latency (CL). In detail, after a time (that is, the number of predetermined clock cycles) determined by the CAS Latency has lapsed from a point at which a read command is input to the semiconductor memory device, the data strobe signal generator generates a data strobe signal. Therefore, the data output circuit of the semiconductor memory device outputs output data to the external device after a time determined by the CAS Latency. In this case, it is preferable to generate (that is, toggle) the data strobe signal a predetermined time in advance of a time at which a semiconductor memory device outputs data. The reason for this is that the pulse width of the data strobe signal is not uniform during an initial interval during which the strobe signal starts to toggle. If the pulse width of the data strobe signal is not uniform, the data output circuit cannot normally output data. Therefore, the data strobe signal generates the data strobe signal during a time (that is, preamble time) that the data strobe signal takes to be stabilized. Meanwhile, as the operation speed of the semiconductor memory device increases, the operation frequency of the semiconductor memory device increases. Since the interval of internal clock signals is shortened in a high-speed semiconductor memory device, it is importance to ensure that a data strobe signal takes is stabilized. However, a conventional strobe signal generator generates a data strobe signal based on a fixed preamble time, so that it may be difficult to ensure a stabilization time during generation of the data strobe signal.

SUMMARY OF THE INVENTION

Accordingly, the present invention has been made keeping in mind the above problems occurring in the prior art, and an object of the present invention is to provide a data strobe signal generator which generates a data strobe signal based on an adjustable preamble value, thereby ensuring the stabilized data output operation of a high speed semiconductor memory device.

Another object of the present invention is to provide a semiconductor memory device which generates a data strobe signal based on an adjustable preamble value, thereby ensuring the stabilized data output operation of a high speed semiconductor memory device.

In order to accomplish the above object, the present invention provides a data strobe signal generator, including a control unit, a pulse delay unit, a clock generator, and a data strobe output unit. The control unit generates a CAS latency signal and a preamble signal in response to a mode register set signal, an extended mode register set signal and address signals. The pulse delay unit delays a pulse signal for predetermined time and outputs a delayed pulse signal, in response to the CAS latency signal and the preamble signal. The clock generator outputs a control clock signal in response to the CAS latency signal and the preamble signal. The data strobe output unit outputs a data strobe signal in response to the delayed pulse signal and the control clock signal.

Additionally, the present invention provides a synchronous semiconductor memory device, including an internal core circuit, at least one data output circuit, and a data strobe signal generator. The internal core circuit has a memory cell array. The at least one data output circuit outputs output data received from the internal core circuit to an external device via at least one data input/output pin. The data strobe signal generator generates a data strobe signal in response to a mode register set signal, an extended mode register set signal, address signals and an internal clock signal.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Figure 1:
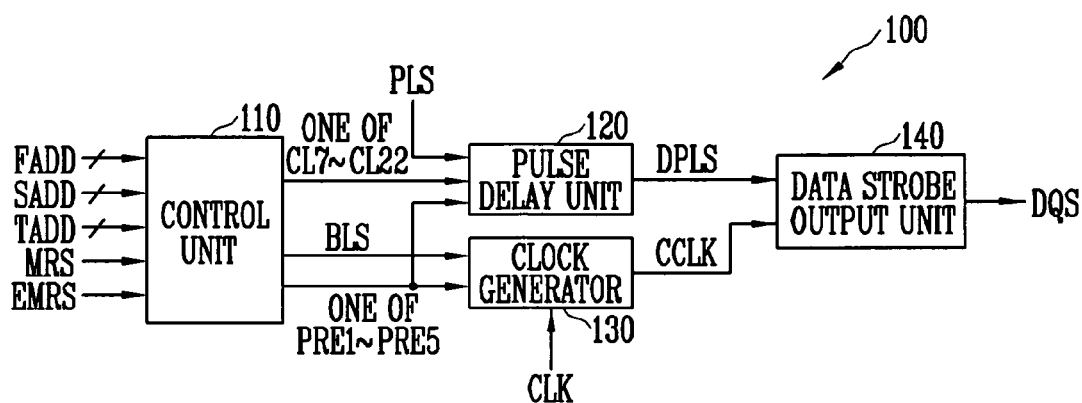
FIG. 1 is a block diagram illustrating a data strobe signal generator according to an embodiment of the present invention.

Reference now should be made to the drawings, in which the same reference numerals are used throughout the different drawings to designate the same or similar components.

Preferred embodiments of the present invention are described below with reference to the accompanying drawings.

FIG. 1 is a block diagram illustrating a data strobe signal generator according to an embodiment of the present invention. Referring to the FIG. 1, the data strobe signal generator 100 includes, a control unit 110, a pulse delay unit 120, a clock generator 130, and a data strobe output unit 140. The control unit 110 generates one of CAS latency signals CL7~CL22 and one of preamble signals PRE1~PRE5 in response to a mode register set signal MRS, an extended mode register set signal EMRS, and address signals FADD and SADD. The mode register set signal MRS is enabled when a mode register set command is generated in a semiconductor memory device 200 (see FIG. 6) including the data strobe signal generator 100. Furthermore, the extended mode register set signal EMRS is enabled when an extended mode register set command is generated in the semiconductor memory device 200.

Preferably, the semiconductor memory device 200 includes a mode register (not shown) for generating the mode register set command and an extended mode register (not shown) for generating the extended mode register set command. The CAS latency signals CL7~CL22 respectively include pieces of information about different data output time. The data output time is a time taken from a time point at which a read command is input to the semiconductor memory device 200 to a time point at which the semiconductor memory device 200 outputs output data.

For example, the CAS latency signals CL7~CL22 respectively represent 7 to 22 clock cycles of an internal clock signal CLK. That is, the CAS latency signal CL7 indicates that a time, which is taken from a time at which the read command is input to the semiconductor memory device 200 to a time at which the semiconductor memory device 200 outputs output data, is 6 clock cycles. In this case, at the rising (or falling) edge of a seventh clock cycle, the semiconductor memory device 200 outputs data. The preamble signals PRE1~PRE5 respectively include information about different initial toggle time (that is, preamble values). The initial toggle time is a time that the data strobe signal DQS takes to start to toggle and to be then stabilized. For example, the preamble signals PRE1~PRE5 respectively represent the first to fifth clock cycles of the internal clock signal CLk. That is, the preamble signal PRE1 represents a first clock cycle, and the preamble signal PRE2 represents a second clock cycle. Preferably, the data output time T1 (see FIG. 5) includes the initial toggle time T2. In this case, the reason why the initial toggle time T2 of the data strobe signal DQS is required is that when the strobe signal DQS initially starts to toggle, the magnitude of the pulse width of the data strobe signal DQS may not be uniform. The pulse delay unit 120 delays a pulse signal PLS for a predetermined time to output the delayed pulse signal in response to one of the CAS latency signals CL7~CL22 and one of the preamble signals PRE1~PRE5. Preferably, the pulse signal PLS is a high or low pulse signal. The clock generator 130 generates a control clock signal CCLK in response to the one of the preamble signals PRE1~PRE5 and an internal clock signal CLK. In detail, the clock generator 130 outputs the internal clock signal CLK corresponding to the number of clock cycles determined by one of the preamble signals PRE1~PRE5 as the control clock signal CCLK. For example, if the data strobe signal generator is included in an semiconductor memory device, the burst length of which is set to 8, the clock generator 130 outputs the internal clock signal CLK corresponding to the 5 clock cycles as the control clock signal CCLK when the preamble signal PRE1 is received. Furthermore, the clock generator 130 outputs the internal clock signal CLK corresponding to 6 clock cycles as the control clock signal CCLK when the preamble signal PRE2 is received.

Meanwhile, the control unit 110 may further generate a burst length signal BLS in response to the mode register set signal EMRS and the address signal TADD. In this case, the clock generator 130 generates the control clock signal CCLK in response to one of the preamble signals PRE1~PRE5, the burst length signal BLS and the internal clock signal CLK. In detail, the clock generator 130 outputs the internal clock signal CLK corresponding to the number of clock cycles determined by one of the preamble signals PRE1~PRE5 and the burst length signal BLS as the control clock signal CCLK. As a result, if the control unit 110 does not generate the burst length signal BLS, the clock generator 130 outputs the control clock signal CCLK in response to one of the preamble signals PRE1~PRE5. Furthermore, if the control unit 110 generates the burst length signal BLS, the burst length can be selectively changed. In this case, the clock generator 130 outputs the internal clock signal CLK corresponding to the number of clock cycles which is determined by the burst length signal BLS and one of the preamble signals PRE1~PRE5 as the control clock signal CCLK. The data strobe output unit 140 outputs the data strobe signal DQS in response to the delayed pulse signal DPLS and the control clock signal CCLK. Preferably, the data strobe output unit 140 outputs the control clock signal CCLK as the data strobe signal DQS in synchronization with the rising or falling edge of the delayed pulse signal DPLS.

Figure 2:
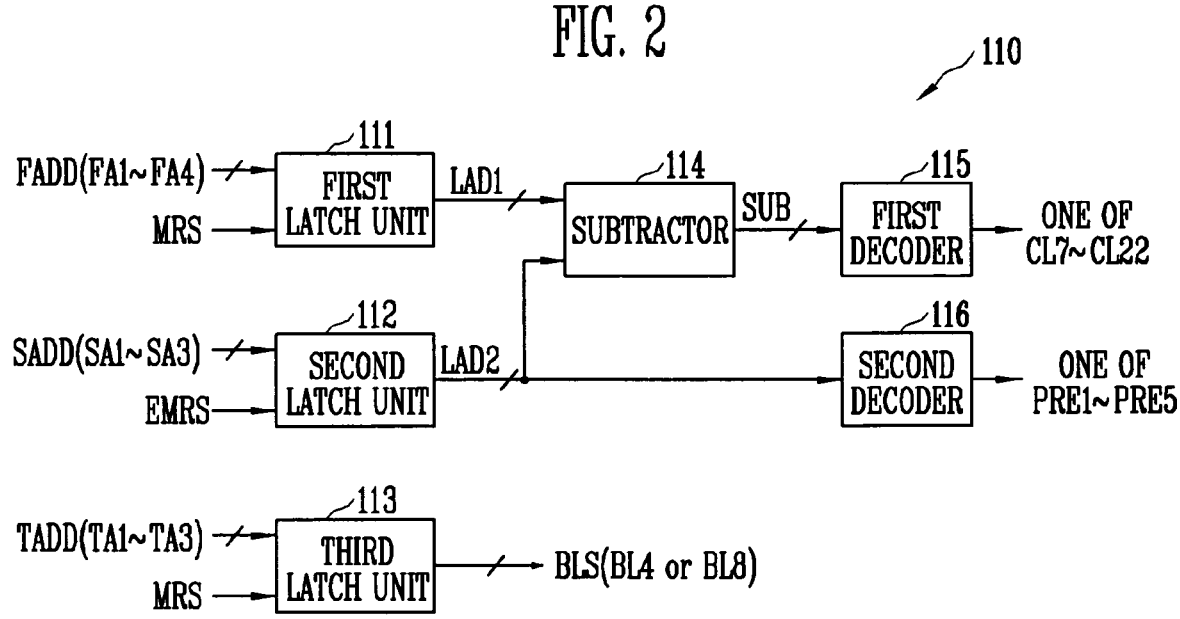
FIG. 2 illustrates an example of the control unit.
Figure 3:
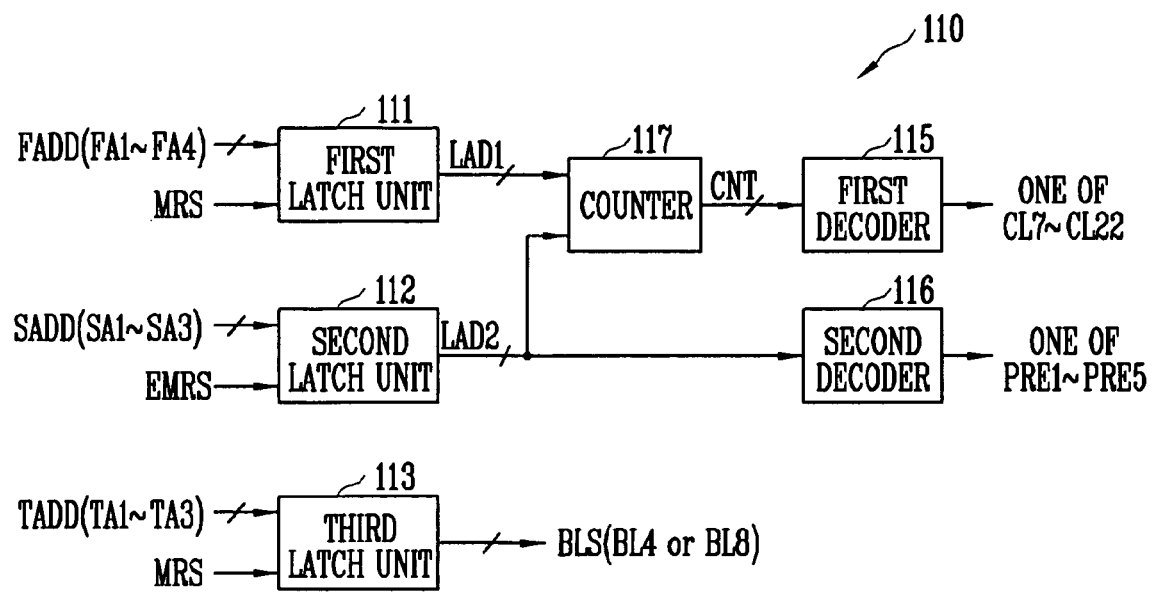
FIG. 3 illustrates another example of the control unit.

FIGS. 2 and 3 are block diagrams of the control unit shown in FIG. 1. FIG. 2 illustrates an example of the control unit, and FIG. 3 illustrates another example of the control unit. First, referring to FIG. 2, the control unit 110 includes first to third latch units 111~113, a first decoder 115, and a second decoder 116. The first latch unit 111 latches the address signal FADD and outputs a first latch signal LAD1 in response to the mode register set signal MRS. The address signal FADD may include bits FA1~FA4. In this case, the first latch signal LAD1 is 4 bits. The second latch unit 112 latches the address signal SADD and outputs a second latch signal LAD2 in response to the extended mode register set signal EMRS. The address signal SADD may include bits SA~SA3. In this case, the second latch signal LAD2 is 3 bits. The third latch unit 113 latches the address signal TADD and outputs the latched signal as the burst length signal BLS in response to the mode register set signal MRS. The address signal TADD may include bits TA1~TA4. In this case, the burst length signal BLS is 3 bits. The bit value of the burst length signal BLS includes burst length information (for example, burst length 4 (BL4) or burst length 8 (BL8)). That is, depending on the bit value of the burst length signal BLS, the burst length is determined. For example, in the case of a semiconductor memory device supporting burst length 4 and burst length 8, burst length 4 and burst length 8 can be respectively expressed using two of 9 bit values which can be expressed by 3 bits. For example, when the bit value of the burst length signal BLS is "000", the burst length signal BLS can express burst length 4. Furthermore, when the bit value of the burst length signal BLS is "001", the burst length signal BLS can express burst length 8. Although, in this embodiment, burst lengths 4 and 8 are described, various burst lengths may be set using 9 bit values which can be expressed by 3 bits. Furthermore, the bit number of the burst length signal BLS can be also variously changed.

The subtractor 114 subtracts the bit value of the second latch signal LAD2 from the bit value of the first latch signal LAD1, and outputs a subtraction signal SUB based on the results of the subtraction. For example, when the bit value of the first latch signal LAD1 is '1010' and the bit value of the second latch signal LAD2 is '001', the subtractor 114 outputs the bit value of the subtraction signal SUB as '1000'. The first decoder 115 decodes the subtraction signal SUB and outputs one of the CAS latency signals CL7~CL22 based on the results of the decoding. For example, when the subtraction signal SUB having a bit value of '1000' is received, the first decoder 115 outputs the CAS latency signal CL8. In this case, the CAS latency signals CL7~CL22 can respectively correspond to 16 bit values which can be expressed by the 4 bits of the subtraction signal SUB. The second decoder 116 decodes the second latch signal LAD2 and outputs one of the preamble signals PRE1~PRE5 based on the results of the decoding. For example, when the second latch signal LAD2 having a bit value of '001' is received, the second decoder 116 outputs the preamble signal PRE2. Furthermore, the second latch signal LAD2 having a bit value of '000' is received, the second decoder 116 outputs the preamble signal PRE2. In this case, the preamble signals PRE1~PRE5 can respectively correspond to 5 bit values of 9 bit values which can be expressed by the 3 bits of the second latch signal LAD2.

Thereafter, referring to FIG. 3, the controller 110 includes first to third latch units 111~113, a counter 117, a first decoder 115 and a second decoder 116. The operating details of the first to third latch units and the second decoder 116 are the same as what is described above with reference to FIG. 2, so that a detailed description is omitted. The counter 117 performs counting operation in response to first and second latch signals LAD1 and LAD2 and then outputs a counting signal CNT. The first decoder 115 decodes the counting signal CNT and then outputs one of the CAS latency signals CL7~CL22 based on the results of the decoding.

Figure 4:
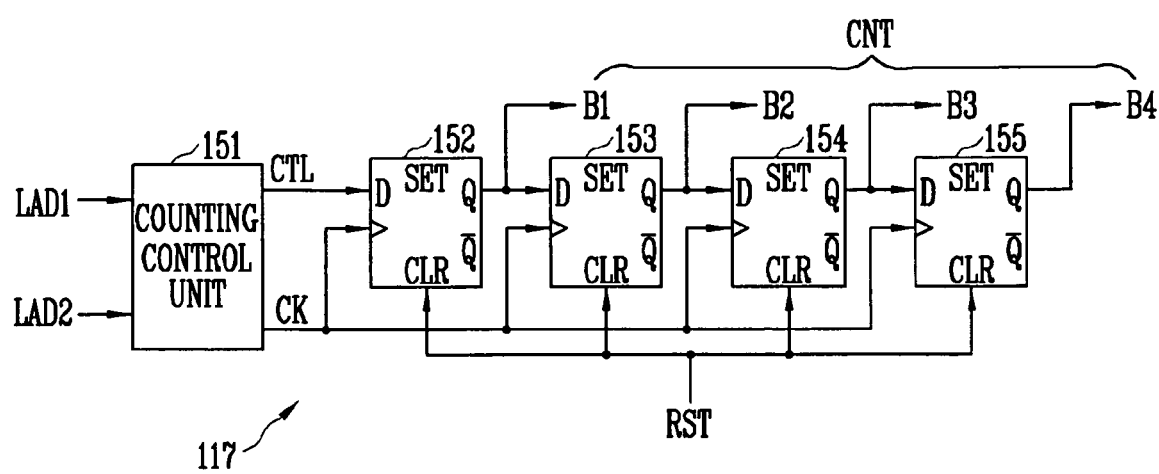
FIG. 4 is a diagram illustrating the counter shown in FIG. 3 in detail.

FIG. 4 is a diagram illustrating the counter shown in FIG. 3 in detail. Referring to FIG. 4, the counter 117 includes a counting controller 151 and N (N is integer) D-flip flops. In FIG. 4, for simplification of the drawing, only four D flip flops 152~155 are illustrated. The counting control unit 151 generates a counting control signal CTL based on the first latch signal LAD1, and generates a counting clock signal CL based on the second latch signal LAD2. The D flip flops 152~155 are connected in series to each other, and respectively output the bits B1~B4 of the counting signal CNT in response to the counting clock signal CK. In detail, the D flip flop 152 receives the counting control signal CTL via an input terminal D and outputs the counting control signal CTL as the bit B1 via an output terminal Q, in response to the counting clock signal CK. Furthermore, the D flip flop 153 receives the bit B1 via an input terminal D and outputs the bit B1 as the bit B2 via an output terminal Q, in response to the counting clock signal CK. Like the D flip flop 152, the D flip flops 154 and 155 respectively receive the bits B2 and B3 and respectively output the bits B2 and B3 as the bits B3 and B4, in response to the counting clock signal CK. The D flip flops 152~155 are separately reset in response to a reset signal RST. Preferably, the bit value of the counting signal CNT generated by the counter 117 is identical to the bit value of the subtraction signal SUB generated by the subtractor 114. For example, when the bit value of the first latch signal LAD1 is '1010', and the bit value of the second latch signal LAD2 is '001', the counting control unit 151 outputs the counting control signal CTL at a logic high level, and generates the counting clock signal CL of 1 clock cycle. As a result, the D flip flop 152 receives the counting control signal CTL, which is logic high, in synchronization with the rising edge of the counting clock signal CK, and outputs the counting control signal CTL as the bit B1. As a result, the bit value of the counting signal CNT becomes '1000'.

The operation of the data strobe signal generator 100 is described in detail with reference to FIG. 5. In this embodiment, the operation of the data strobe signal generator 100 in the case where the control unit 110 generates the burst length signal BLS is described below. First, the mode register set signal MRS and the address signals FADD and TADD are input to the control unit 110. The first latch unit 111 of the control unit 110 latches the address signal FADD and outputs the first latch signal LAD1, in response to the mode register set signal MRS. For example, when the bit value of the address signal FADD is '1010', the first latch unit 111 outputs the first latch signal LAD1 having a bit value of '1010'. Furthermore, the third latch unit 113 of the control unit 110 latches the address signal TADD and outputs the burst length signal BLS, in response to the mode register set signal MRS. For example, when the bit value of the address signal TADD is '001', the third latch unit 113 outputs the burst length signal BLS having a bit value of '001'. When the bit value of the burst length signal BLS is '001', the burst length signal BLS includes burst length information (burst length 8 (BL8)). Furthermore, the extended mode register set signal EMRS and the address signal SADD are input to the control unit 110. The second latch unit 112 of the control unit 110 latches the address signal SADD and outputs the second latch signal LAD2, in response to the extended mode register set signal EMRS. For example, when the bit value of the address signal SADD is '001', the second latch unit 112 outputs the second latch signal LAD2 having a bit value of '001'.

The subtractor 114 (or counter 117) of the control unit 110 outputs the subtraction signal SUB (or counting signal CNT) in response to the first and second latch signals LAD1 and LAD2. In detail, the subtractor 114 subtracts the bit value of the second latch signal LAD2 from the bit value of the first latch signal LAD1, and outputs the subtraction signal having a bit value of '1000'. The first decoder 115 of control unit 110 decodes the subtraction signal SUB (or counting signal CNT) and outputs one of the CAS latency signals CL7~CL22. Since the bit value of the subtraction signal is '1000', the first decoder 115 outputs the CAS latency signal CL8. Furthermore, the second decoder 116 of the control unit 110 decodes the second latch signal LAD2 and outputs one of the preamble signals PRE1~PRE5. Since the bit value of the second latch signal LAD2 is '001', the second decoder 116 outputs the preamble signal PRE2. The pulse delay unit 120 delays the pulse signal PLS for predetermined time and outputs the delayed pulse signal DPLS, in response to the CAS latency signal CL8 and the preamble signal PRE2.

The clock generator 130 outputs the control clock signal CCLK in response to the burst length signal BLS and the preamble signal PRE2. In detail, since the burst length signal BLS represents burst length 8 (BL8) (that is, 4 clock cycles in the case of DDR SDRAM), and the preamble signal PRE2 represents 2 clock cycles, the clock generator 130 outputs the internal clock signal CLK corresponding to 6 clock cycles as the control clock signal CCLK. The data strobe output unit 140 outputs the control clock signal CCLK as the data strobe signal DQS in synchronization with the rising edge (or falling edge) of the delayed pulse signal is DPLS. As a result, the data strobe signal DQS is toggled and stabilized for two clock cycles T2 in advance of a time point P1 at which the semiconductor memory device including the data strobe signal generator 100 outputs output data. Meanwhile, the semiconductor memory device sequentially outputs pieces of output data in synchronization with the rising and falling edges of the data strobe signal DQS. Therefore, the semiconductor memory device outputs pieces output data for time T3 ranged from the time point P1 to the time point P2.

Figure 5:
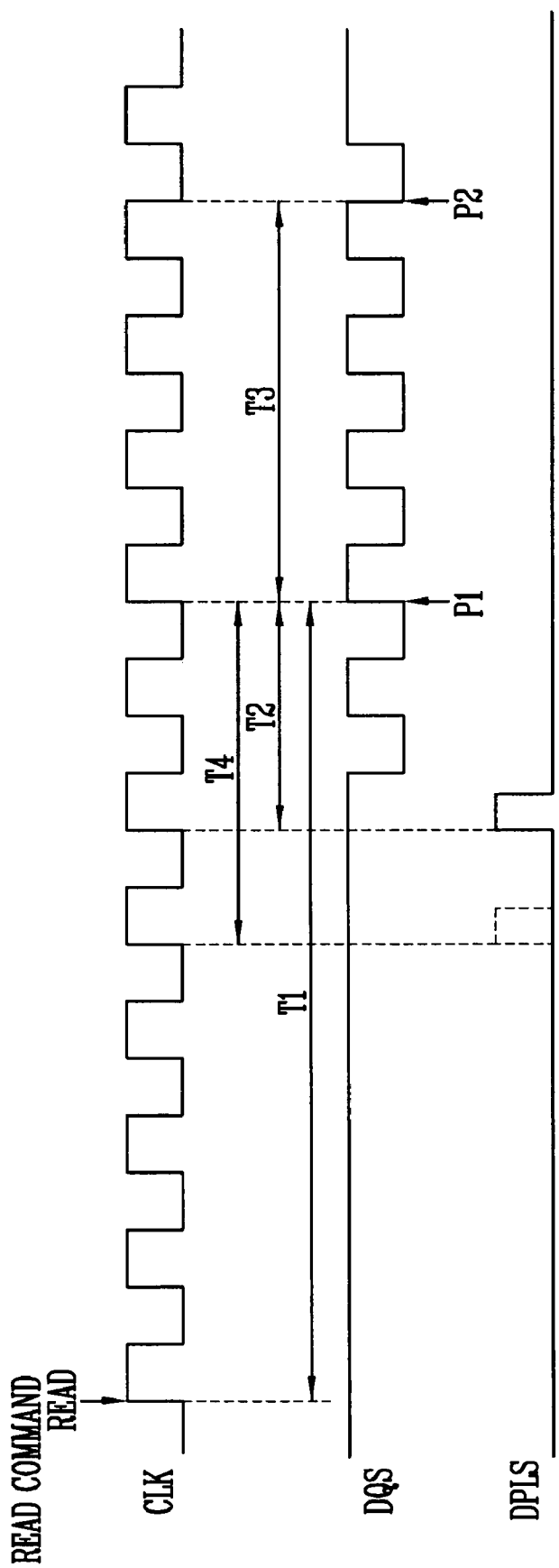
FIG. 5 is a timing diagram illustrating signals related to the operation the data strobe signal generator shown in FIG. 1.

Meanwhile, when the first decoder 115 outputs the CAS latency signal CL8, and the second decoder 116 outputs the preamble signal PRE3, the pulse delay unit 120 outputs the delayed pulse signal DPLS as indicated by the dot lines of FIG. 5. Furthermore, the clock generator 130 outputs the internal clock signal CLK corresponding to 7 clock cycles as the control clock signal CCLK. The data strobe output unit 140 outputs the control clock signal CCLK as the data strobe signal DQS in synchronization with the rising edge (or falling edge) of the delayed pulse signal DPLS. As a result, for two clock cycles T2 a time point P1 at which the semiconductor memory device including the data strobe signal generator 100 outputs output data. As a result, the data strobe signal DQS is toggled and stabilized for three clock cycles T4 in advance of the time point P1 at which the semiconductor memory device including the data strobe signal generator 100 outputs output data.

As described above, the data strobe signal generator 100 can selectively adjust the initial toggle time of the data strobe signal DQS through one of the preamble signals PRE1~PRE5. Therefore, in a high-speed semiconductor memory device which operates according to an internal clock signal having a reduced interval, the initial stabilization time of the data strobe signal can be adjusted. For example, when the operating frequency of a semiconductor memory device increases, the data strobe signal generator 100 can increase the initial toggle time of the data strobe signal. As a result, since the semiconductor memory device outputs output data in synchronization with a sufficiently stabilized data strobe signal, the stabilized data output operation of the high-speed semiconductor memory device can be secured.

Figure 6:
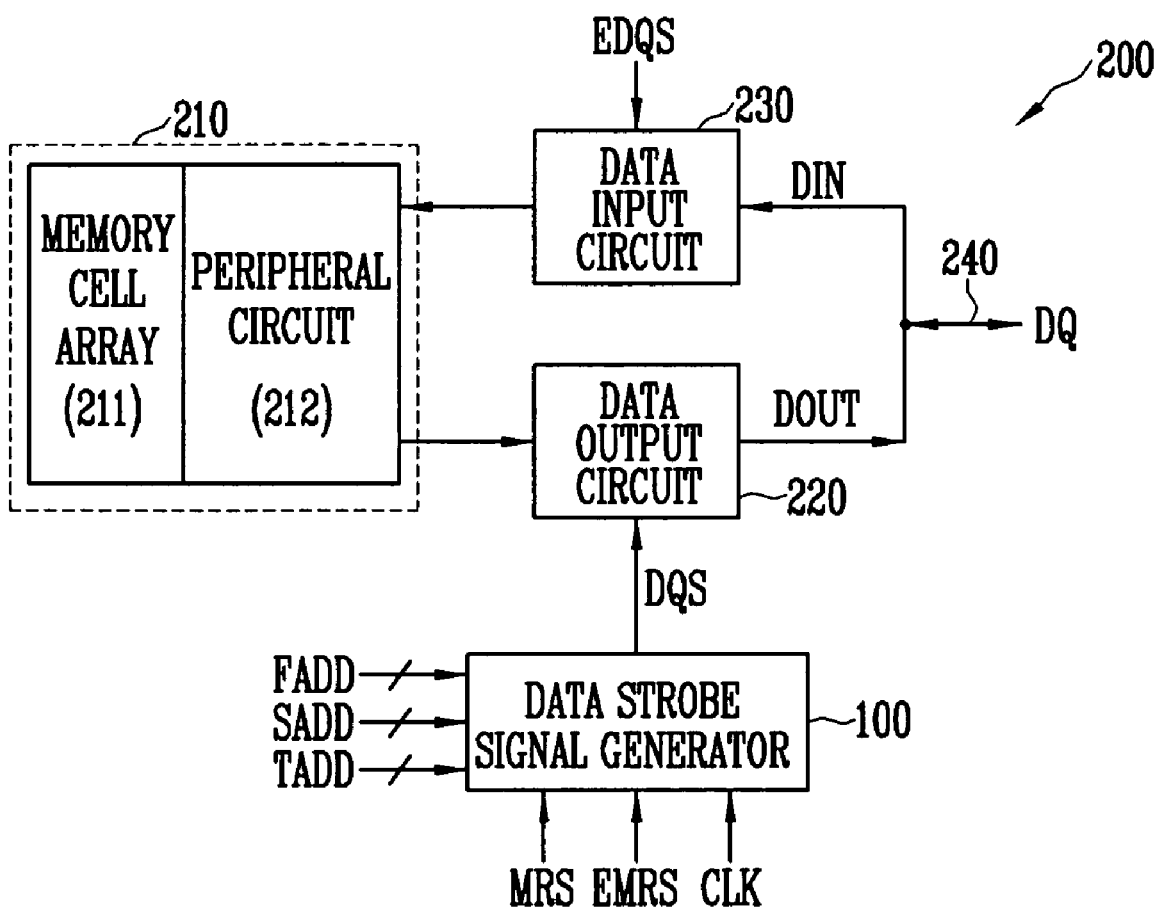
FIG. 6 is a block diagram schematically illustrating the semiconductor memory device according to an embodiment of the present invention.

FIG. 6 is a block diagram schematically illustrating the semiconductor memory device according to an embodiment of the present invention. Referring to FIG. 6, the semiconductor memory device 200 includes an internal core circuit 210, a data output circuit 220, a data input circuit 230, and a data strobe signal generator 100. The internal core circuit 210 includes a memory cell array 211 and a peripheral circuit 212. The data output circuit 220 outputs output data DOUT received from the internal core circuit 210 to an external device (not shown) via a data input/output pin 240 in response to a data strobe signal DQS. The data input circuit 230 outputs input data DIN received from the external device to the internal core circuit 210 via the data input/output pin 240 in response to a data strobe signal EDQS. The data strobe signal EDQS is generated by the external device. The data strobe signal generator 100 outputs the data strobe signal DQS in response to a mode register set signal MRS, an extended mode register set signal EMRS, address signals FADD, SADD and TADD, and an internal clock signal CLK. Since the construction and detail operation of the data strobe signal generator 100 is identical to what is described with reference to FIGS. 1 to 5, the description thereof is omitted in order to avoid the repetition of description.

As described above, the data strobe signal generator and the semiconductor memory device having the same according to the present invention generate a data strobe signal based on an adjustable preamble value, thereby ensuring the stabilized data output operation of a high-speed memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A data strobe signal generator, comprising:
    a control unit for generating a column address strobe (CAS) latency signal and a preamble signal in response to a mode register set signal, an extended mode register set signal and address signals;
    a pulse delay unit for delaying a pulse signal for a predetermined time and outputting a delayed pulse signal in response to the CAS latency signal and the preamble signal;
    a clock generator for outputting a control clock signal in response to the CAS latency signal and the preamble signal; and
    a data strobe output unit for outputting a data strobe signal in response to the delayed pulse signal and the control clock signal.

2. The data strobe signal generator as set forth in claim 1, wherein:
    the CAS latency signal represents information about a data output time;
    the preamble signal represents information about a initial toggle time;
    the data output time is the time taken from the time at which a read command is input to a semiconductor memory device including the data strobe signal generator, to a time at which the semiconductor memory device outputs output data, and the initial toggle time is the time for which the data strobe signal is stabilized; and
    the data output time includes the initial toggle time.

3. The data strobe signal generator as set forth in claim 1, wherein:
    the address signals include a first address signal and a second address signal; and
    the control unit comprises:
    a first latch unit for outputting a first latch signal, in response to the mode register set signal and the first address signal;
    a second latch unit for outputting a second latch signal, in response to the extended mode register set signal and the second address signal;
    a subtractor for subtracting a bit value of the second latch signal from a bit value of the first latch signal and outputting a subtraction signal based on the result of the subtraction;
    a first decoder for decoding the subtraction signal and outputting the CAS latency signal based on the result of the decoding; and
    a second decoder for decoding the second latch signal and outputting the preamble signal based on the result of the decoding.

4. The data strobe signal generator as set forth in claim 3, wherein:
    the address signals further include a third address signal; and
    the control unit further generates a burst length signal in response to the mode register set signal and the third address signal.

5. The data strobe signal generator as set forth in claim 4, wherein the clock generator outputs the internal clock signal corresponding to a number of clock cycles, determined by the preamble signal and the burst length signal, as the control clock signal.

6. The data strobe signal generator as set forth in claim 4, wherein the control unit further comprises a third latch unit for latching the third address signal and outputting the latched signal as the burst length signal, in response to the mode register set signal.

7. The data strobe signal generator as set forth in claim 6, wherein:
    the mode register set signal is enabled when a mode register set command is generated, and the extended mode register set signal is enabled when an extended register set command is generated;
    the first latch unit latches the first address signal when the mode register set signal is enabled;

the second latch unit latches the second address signal when the extended mode register set signal is enabled; and the third latch unit latches the third address signal when the mode register set signal is enabled.

8. The data strobe signal generator as set forth in claim 4, wherein the first to third address signals and the subtraction signal respectively include a plurality of bits, and the number of bits in the first address signal is larger than the number of bits in the second address signal.

9. The data strobe signal generator as set forth in claim 1, wherein:
the address signals include a first address signal and a second address signal; and
the control unit comprises:
a first latch unit for outputting a first latch signal, in response to the mode register set signal and the first address signal;
a second latch unit for outputting a second latch signal, in response to the extended mode register set signal and the second address signal;
a counter for performing a counting operation in response to the first and second latch signals and outputting a counting signal;
a first decoder for decoding the counting signal and outputting the CAS latency signal based on the result of the decoding; and
a second decoder for decoding the second latch signal and outputting the preamble signal based on the result of the decoding.

10. The data strobe signal generator as set forth in claim 9, wherein:
the address signals further include a third address signal; and
the control unit further generates a burst length signal in response to the mode register set signal and the third address signal.

11. The data strobe signal generator as set forth in claim 10, wherein the clock generator outputs the internal clock signal corresponding to a number of clock cycles, determined by the preamble signal and the burst length signal, as the control clock signal.

12. The data strobe signal generator as set forth in claim 10, wherein the control unit further comprises a third latch unit for latching the third address signal and outputting the latched signal as the burst length signal, in response to the mode register set signal.

13. The data strobe signal generator as set forth in claim 12, wherein:
the mode register set signal is enabled when a mode register set command is generated, and the extended mode register set signal is enabled when an extended register set command is generated;
the first latch unit latches the first address signal when the mode register set signal is enabled;
the second latch unit latches the second address signal when the extended mode register set signal is enabled; and
the third latch unit latches the third address signal when the mode register set signal is enabled.

14. The data strobe signal generator as set forth in claim 12, wherein:
the counting signal includes first to Nth (N is integer) bits; and the counter comprises:

a counter control unit for outputting a counting control signal based on the first latch signal and outputting a counting clock signal based on the second latch signal; and first to N-th flip flops connected in series to each other, and configured to respectively output the first to N-th bits in response to the counting clock signal;
wherein the first flip flop receives the counting control signal and outputs the received counting control signal as the first bit, in response to the counting clock signal;
the second to N-th flop flops respectively receive the first to N-1-th bits and respectively output the received first to N-1-th bits as the second to N-th bits, in response to the counting clock signal.

15. The data strobe signal generator as set forth in claim 14, wherein:
the counting control unit toggles the counting control signal by a number determined by first latch signal's bit value and toggles the counting clock signal by a number determined by a bit value of the second latch signal; and
when the toggle numbers of the counting control signal and the counting clock signal are changed, the bit value of the counting signal is altered.

16. The data strobe signal generator as set forth in claim 1, wherein the clock generator outputs the internal clock signal corresponding to a number of clock cycles which is determined by the preamble signal as the control clock signal.

17. A synchronous semiconductor memory device, comprising:
an internal core circuit having a memory cell array;
at least one data output circuit for outputting output data received from the internal core circuit to an external device via at least one data input/output pin; and
a data strobe signal generator for generating a data strobe signal in response to a mode register set signal, an extended mode register set signal, address signals and an internal clock signal,
wherein the data strobe signal generator comprises:
a control unit for generating a column address strobe (CAS) latency signal and a preamble signal in response to the mode register set signal, the extended mode register set signal and address signals;
a pulse delay unit for delaying a pulse signal for predetermined time and outputting a delayed pulse signal, in response to the CAS latency signal and the preamble signal;
a clock generator for outputting a control clock signal in response to the CAS latency signal and the preamble signal; and
a data strobe output unit for outputting a data strobe signal in response to the delayed pulse signal and the control clock signal.

18. The synchronous semiconductor memory device as set forth in claim 17, wherein:
the CAS latency signal represents information about a data output time;
the preamble signal represents information about a initial toggle time;
the data output time is the time taken from the time at which a read command is input to a semiconductor memory device including the data strobe signal generator, to a time at which the semiconductor memory device outputs output data, and the initial toggle time is the time for which the data strobe signal is stabilized; and
the data output time includes the initial toggle time.

19. The synchronous semiconductor memory device as set forth in claim 17, wherein:

the address signals include a first address signal and a second address signal; and the control unit comprises:

a first latch unit for outputting a first latch signal, in response to the mode register set signal and the first address signal;

a second latch unit for outputting a second latch signal, in response to the extended mode register set signal and the second address signal;

a subtractor for subtracting a bit value of the second latch signal from a bit value of the first latch signal and outputting a subtraction signal based on the result of the subtraction;

a first decoder for decoding the subtraction signal and outputting the CAS latency signal based on the result of the decoding; and a second decoder for decoding the second latch signal and outputting the preamble signal based on the result of the decoding.

20. The synchronous semiconductor memory device as set forth in claim 19, wherein:

the address signals further include a third address signal; and the control unit further generates a burst length signal in response to the mode register set signal and the third address signal.

21. The synchronous semiconductor memory device as set forth in claim 20, wherein the clock generator outputs the internal clock signal corresponding to a number of clock cycles, determined by the preamble signal and the burst length signal, as the control clock signal.

22. The synchronous semiconductor memory device as set forth in claim 20, wherein the control unit further comprises a third latch unit for latching the third address signal and outputting the lathed signal as the burst length signal, in response to the mode register set signal.

23. The synchronous semiconductor memory device as set forth in claim 17, wherein:

the address signals include a first address signal and a second address signal; and the control unit comprises:

a first latch unit for outputting a first latch signal, in response to the mode register set signal and the first address signal;

a second latch unit for outputting a second latch signal, in response to the extended mode register set signal and the second address signal;

a counter for performing a counting operation in response to the first and second latch signals and outputting a counting signal;

a first decoder for decoding the counting signal and outputting the CAS latency signal based on the result of the decoding; and a second decoder for decoding the second latch signal and outputting the preamble signal based on the result of the decoding.

24. The synchronous semiconductor memory device as set forth in claim 23, wherein:

the address signals further include a third address signal; and the control unit further generates a burst length signal in response to the mode register set signal and the third address signal.

25. The synchronous semiconductor memory device as set forth in claim 24, wherein the clock generator outputs the internal clock signal corresponding to a number of clock cycles, which is determined by the preamble signal and the burst length signal, as the control clock signal.

26. The synchronous semiconductor memory device as set forth in claim 24, wherein the control unit further comprises a third latch unit for latching the third address signal and outputting the lathed signal as the burst length signal, in response to the mode register set signal.

27. The synchronous semiconductor memory device as set forth in claim 23, wherein:

the counting signal includes first to Nth (N is integer) bits; and the counter comprises:

a counter control unit for outputting a counting control signal based on the first latch signal and outputting a counting clock signal based on the second latch signal; and first to N-th flip flops connected in series to each other, and configured to respectively output the first to N-th bits in response to the counting clock signal;

wherein the first flip flop receives the counting control signal and outputs the received counting control signal as the first bit, in response to the counting clock signal;

the second to N-th flop flops respectively receive the first to N−1-th bits and respectively output the received first to N−1-th bits as the second to N-th bits, in response to the counting clock signal.

28. The synchronous semiconductor memory device as set forth in claim 27, wherein:

the counting control unit toggles the counting control signal by a number determined by a bit value of the first latch signal and toggles the counting clock signal by a number determined by a bit value of the second latch signal; and when the toggle numbers of the counting control signal and the counting clock signal are changed, a bit value of the counting signal is altered.

29. The synchronous semiconductor memory device as set forth in claim 17, wherein the clock generator outputs the internal clock signal corresponding to a number of clock cycles which is determined by the preamble signal as the control clock signal.

30. The synchronous semiconductor memory device as set forth in claim 17, further comprising at lease one data input circuit for outputting input data received from the external device to the internal corn circuit via the at least one data input/output pin in response to an additional data strobe signal.

* * * * *